United States Patent [19]
Cedell et al.

[11] Patent Number: 5,792,284
[45] Date of Patent: Aug. 11, 1998

[54] MAGNETOSTRICTIVE POWDER COMPOSITE AND METHODS FOR THE MANUFACTURE THEREOF

[75] Inventors: Tord Cedell, Lund; Lars Sandlund, Knivsta, both of Sweden

[73] Assignees: Fox Technology KB, Padua, Italy; Proengco AB, Upsala, Sweden

[21] Appl. No.: 441,661

[22] Filed: May 15, 1995

Related U.S. Application Data

[63] Continuation-in-part of Ser. No. 150,091, filed as PCT/SE92/00331, May 19, 1992, published as WO92/20829, Nov. 26, 1992, abandoned.

[30] Foreign Application Priority Data

May 22, 1991 [SE] Sweden ................................ 9101535

[51] Int. Cl.$^6$ ............................................. H01F 1/047
[52] U.S. Cl. ........................... 148/301; 148/101; 148/103; 148/104; 148/108; 252/62.54; 252/62.55; 335/215
[58] Field of Search ............................ 148/101, 104, 148/103, 108, 301; 252/62.53, 62.54, 62.55; 335/215

[56] References Cited

U.S. PATENT DOCUMENTS

| | | | |
|---|---|---|---|
| 3,949,351 | 4/1976 | Clark et al. | 148/301 |
| 4,152,178 | 5/1979 | Malekzadeh et al. | 148/103 |
| 4,158,368 | 6/1979 | Clark | 137/487.5 |
| 4,308,474 | 12/1981 | Savage et al. | 148/301 |
| 4,375,372 | 3/1983 | Koon et al. | 148/301 |
| 4,378,258 | 3/1983 | Clark et al. | 148/100 |
| 4,644,310 | 2/1987 | Anderson, III et al. | 335/215 |
| 4,845,450 | 7/1989 | Porzio et al. | 335/215 |
| 5,110,376 | 5/1992 | Kobayashi et al. | 148/301 |

FOREIGN PATENT DOCUMENTS 2 065 359 7/1971 France.

*Primary Examiner*—John Sheehan
*Attorney, Agent, or Firm*—Pravel, Hewitt, Kimball & Krieger

[57] ABSTRACT

Magnetostrictive powder composite and method for the manufacturing of the magnetostrictive powder composite. The composite comprises magnetostrictive powder grains with chemical composition $(RE)_x T_{1-x}$, where RE represents one or a mixture of several rare earth metals, T represents iron, nickel, cobalt, manganese or a mixture of these metals and x represents atomic fraction assuming a value between 0 and 1, whereby the grains are held together by a binder. The magnetostrictive grains constitute greater than 60 percent by volume of the composite. The composite is produced by pressing together magnetostrictive powder grains and the binder. Isostatic pressure may be used in the pressing step.

30 Claims, 3 Drawing Sheets

MAGNETOSTRICTIVE POWDER COMPOSITE AND METHODS FOR THE MANUFACTURE THEREOF

This is a continuation-in-part of application Ser. No. 08/150,091 filed on Jul. 28, 1994, now abandoned. U.S. patent application Ser. No. 08/150,091 was filed under 35 U.S.C. § 371 claiming the benefit of PCT/SE92/00331, with a PCT filing date of May 19, 1992, published as WO92/20829, Nov. 26, 1992, and with priority claimed from Swedish patent application 9101535-4 filed May 22, 1991.

BACKGROUND OF THE INVENTION

1. Field of the Invention

The invention relates to a magnetostrictive powder composite and methods for manufacturing the powder composite. More specifically, the magnetostrictive powder, in the form of grains, conforms to the chemical composition $(RE)_xT_{1-x}$, where RE represents one or a mixture of several rare earth metals, T represents Fe, Ni, Co, or Mn, or a mixture of two or more of these metals, and x is a value between zero and one. The powder grains are held together by a binder that prevents electrical contact between grains.

2. Description of the Related Art

To clarify the difference between permanent magnets and magnetostrictive powder composites, key properties and areas of applications for both materials are listed below:

PERMANENT MAGNETS

Properties

1. Permanent magnets, usually compounds of rare earth metals and transition metals (Fe, Ni, Co) like for instance $SmCo_5$ and $Nd_2Fe_{14}B$, are passive devices used for generating a magnetic field.
2. Permanent magnets can only generate static magnetic fields.
3. Permanent magnets are magnetized initially and posses high remanence and high coercive force. Unreasonably high energy would be needed to change the magnetic field, which makes it practically impossible to use permanent magnets for purposes other than to generate static magnetic fields.
4. Permanent magnets do not need an electric current flowing in a coil or a solenoid to generate and maintain the magnetic field.

Application areas

A. Permanent magnets are used for generation of large static fields in situations where it is difficult to provide electric power or where the availability of electric power is limited, or where geometrical constraints such as space restrictions generate their use rather than electromagnets.

B. The main applications of permanent magnets are in electric motors (in which electric energy is converted into mechanical energy), generators (in which mechanical energy is converted into electrical energy), loudspeakers, control devices for electron beams such as in TV sets, magnetic levitation systems, and various forms of holding magnets such as door catches. For example $Nd_2Fe_{14}B$ magnets developed by General Motors are used in the starter motors of their cars and trucks.

MAGNETOSTRICTIVE POWDER COMPOSITE

Properties

1. Magnetostrictive powder composite is an active device comprising rare earth metals (RE) and transition metals (Fe, Ni, Co and Mn), $(RE)_xFe_{1-x}$, which changes its length extremely much when exposed to an external magnetic field. In contrast to traditional magnetostrictive materials, such as Fe and Ni which display magnetostrictive change in length of 9 μm/m and 40 μm/m respectively, a magnetostrictive powder composite displays length changes of more than 1000 μm/m and is therefore called giant magnetostrictive material. Because of this, the magnetostrictive powder composite is used to generate large and fast movements of high precision and large force. In most applications this large force is used to increase change in length and to generate larger movements.

2. Magnetostrictive powder composite is usually used in high frequency applications (up to 60 kHz), e.g. for ultrasonics. In this application the purpose of the magnetostrictive composite is that it should work as an acoustic projector i.e. to generate fast mechanical movements and ultrasound.

3. Magnetostrictive powder composite is initially a material with low ferromagnetism. Magnetic moments within the magnetic domains in the material are randomly oriented i.e. the material is not magnetized as in the case of the above mentioned permanent magnets. For a powder composite to produce a length change one has to apply mechanical stress on the material to rotate magnetic domains relative the direction of the applied stress, as well as to apply a high magnetic field by feeding current into a coil surrounding the material. Typical magnetic fields are 1–8 kOe.

4. The material constituting the magnetostrictive powder composite has low remanence and low coercive force. Chemical composition of the powder is chosen so that the anisotropic energy is minimized. If one omitted to do so it would be very difficult to use the material in practice.

5. Magnetic powder composite has been put forward with a purpose to increase the bandwidth of the casted giant magnetostrictive material available on the market. Magnetostrictive powder composite can manage a frequency region of 0–60 kHz, while casted giant magnetostrictive material only can manage 0–2 kHz. Giant magnetostrictive alloys made of terbium, dysprosium and iron are usually called Terfenol-D.

Application areas

Giant magnetostrictive powder composite is used in:

A.
acoustic underwater sound projectors for high frequencies,
acoustic projectors for ultrasound applications (20–60 kHz),
vibration generators (0–60 kHz),
positioners (to generate fast, high precision motion), and B.
wide bandwidth sound projectors and vibrators in which the amplitude does not change with frequency or load, which is the case with conventional electromagnets.

Magnetostrictive powder composite according to the invention presented has not been known of before. For example the patent documents U.S. Pat. No. 4,865,660, DK, B. 157 222, FR, A, 2065 359 and EP, A1, 175 535 do certainly refer to magnetic powder composite materials, which nevertheless all are permanet magnets and which find their applications because of their capability to maintain permanent magnetization. Magnetostrictive properties are not mentioned in the above referred documents. The fact that the materials mentioned in these documents include powder grains of rare earth metals and transition metals is of no importance in this context.

U.S. Pat. No. 4,378,258 to Clark et al. discusses ErFe$_2$ and TbFe$_2$ magnetostrictive compositions produced by mixing the magnetostrictive materials with epoxy resins, followed by curing. Clark et al. states that good magnetostrictive properties and good secondary properties are obtained when the magnetostrictive material constitutes 20–60% by volume of the composition.

When using conventional magnetostrictive materials and in particular alloys of type $(RE)_xT_{1-x}$, where RE represents one or a mixture of several rare earth metals, T represents Fe, Ni, Co or Mn or a mixture of two or more of these metals and x assuming a value $0<x \leq 1$ represents atomic fraction, below mentioned rods, the following inconveniences will be manifested:

1. The magnetostrictive materials are manufactured in the form of rods by casting. The cast rods hereby get brittle characteristics and are because of this very difficult to machine with conventional techniques.
2. Scrap from crushed rods is difficult to reuse.
3. The rods are brittle and can only withstand very small tensional stress.
4. Due to a relatively low resistivity of cast magnetostrictive rods, like for instance Terfenol-D rods, in order to increase the frequency performance of the said rods, it is often neccessary to slice the rods and to glue them together again in order to decrease the electrically conductive cross section of the material and to thereby decrease eddy current losses.
5. Due to the low permeablity of a conventional casted magnetostrictive rod it is difficult to magnetize homogeneously such a rod by the use of permanent magnets applied at its ends. Usually a fairly homogeneous magnetic flux can only be achieved if the rod length is not larger than 3 times its diameter.
6. The low permeability of the cast rod also causes magnetization at the rod ends to be lower compared to the rod centre when a conventional coil is used to magnetize the rod.
7. So far it has only been possible to produce magnetostrictive elements in form of rods with circular cross sections. This causes a large material wastage and a costly machining if another geometrical form is required.

SUMMARY OF THE INVENTION

The invention provides magnetostrictive composites and methods for producing these composites that overcome the above disadvantages in the art.

By either crushing the scrapped magnetostrictive rods in an oxygen free atmosphere, or crushing magnetostrictive ingots or directly atomizing magnetostrictive powder or by hydrogen decrepitation producing a magnetostrictive powder, and thereafter pressing the crushed scrap or powder together with a binder to produce a magnetostrictive composite with a magnetostrictive material volume percent of greater than 60%, all of the above accounted inconveniences can be decreased or eliminated. To maximize the magnetostriction one can magnetically align the material before it is pressed isostatically and the binder has been cured. This is accomplished by applying a magnetizing field along the working direction of the magnetostrictive powder composite.

The above mentioned disadvantages 1–6 with the existing technique are matched by the following advantages if the invention is utilized:

1. The powder composite is so tough that it can be shaped with a conventional cutting technique.
2. Scrap from crushed rods can be ground in an oxygen free atmosphere and thereafter reused for new rods.
3. If for example reinforcement fibres, preferably of aluminium oxide, silicon carbide, aramide fiber, carbon, glass or titanium, are pressed into the rod and aligned longitudinally or perpendicularly, tensile strength and elastic modulus will be increased.
4. By coating the grain surface with an electrically insulating material or by using a binder that insulates the grains from each other, eddy current losses can be decreased. The invention utilizes such binding agents which wet said grains and bind them together and possibly also form an electrically conducting layer between the powder grains or between the grain agglomerates. These requirements are fulfilled e.g. by a number of known resins and thermoplastics. Ceramics and oxides, preferably rare earth oxides because of a high reactivity of Terfenol-D, can also be used as an insulating coating.
5. A homogeneous magnetic field generated by permanent magnets can be achieved if a powder of a permanent magnet type, preferably $Nd_2Fe_{14}B$, is mixed with the magnetostrictive powder, preferably along the rod axis, in order to decrease the leakage flux. This will make it possible to manufacture rods with length/diameter ratios larger than 3:1.
6. To avoid lowering of magnetization at the rod ends high permeability and high resistivity powder grains, preferably of coated iron, nickel, cobalt or amorphous iron, like for instance metglas, or alloys of these, can be pressed into the rod ends.
7. Magnetostrictive powder composite can be directly pressed to a final shape, whereby expensive material wastage is avoided.

In addition, the invention provides for the following advantages:

The surface friction of the magnetostrictive powder composite can be lowered, so that it can glide easier against other objects. Also, its chemical resistance can be increased by coating the magnetostrictive powder composite, after it has been pressed, with a thin layer of non-organic material, such as aluminium oxide or an organic material, such as teflon, or if during pressing the composite surface is provided with a powder coating made of the above mentioned organic or non-organic materials.

The strength of the magnetic powder composite can be increased by coating its surfaces, which are in contact with other objects and thereby are exposed to a mechanical load, with a layer made of e.g. aluminium oxide or silicon carbide.

In addition, by the use of powder technology, additional coil loops and/or coolant channels can be integrated into the pressed form.

BRIEF DESCRIPTION OF THE DRAWINGS

Embodiments of the invention are shown in the enclosed figures.

DETAILED DESCRIPTION OF THE PREFERRED EMBODIMENTS

Figure 1:
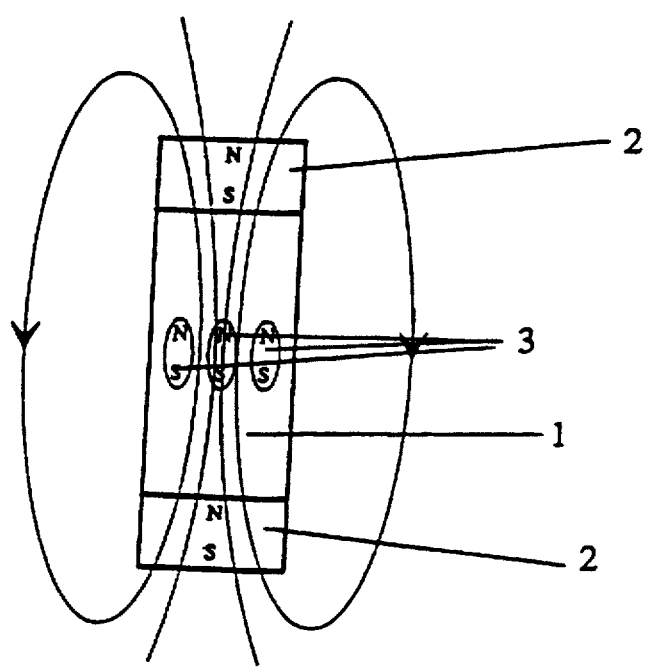
FIG. 1 shows a magnetostrictive composite rod 1 which, besides the magnetostrictive powder, possible coating and a binder, also has permanent magnets 2 of a conventional type at the rod ends and aligned permanent magnet powder 3, mainly along the longitudinal axis of rod 1, which makes the working magnetization in the composite rod 1 more homogeneous.
Figure 2:
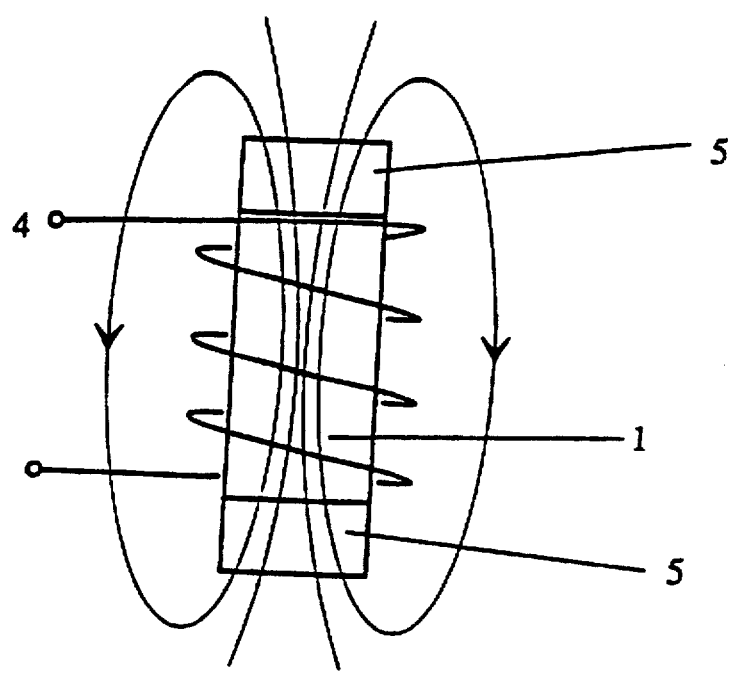
FIG. 2 shows a magnetostrictive composite rod 1, an excitation coil for generating magnetizing field 4 and iron powder, coated with a thin electrically insulating layer of $Fe_2O_3$ or equivalent material, which has been pressed into the ends 5 of the rod 1. With this design a homogeneous magnetic flux in the composite rod 1 is achieved.
Figure 3:
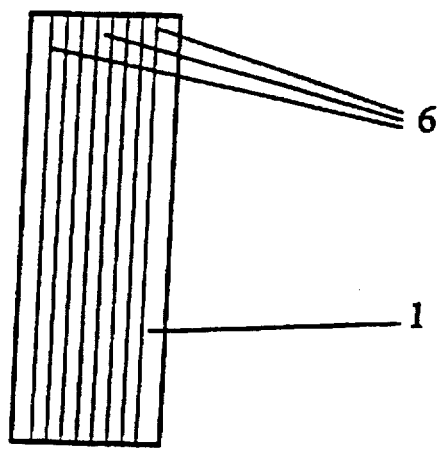
FIG. 3 shows a magnetostrictive composite rod 1 with longitudinal fibre reinforcement 6 which, besides reinforcing the rod 1 and increasing its strength against tensile stress, also makes it possible to build in a prestress into the rod 1.

The magnetostrictive composite material according to the invention must exhibit low anisotropic energy and high magnetostriction in order to find practical use. It is therefore important to minimize the anisotropic energy and at the same time to optimize the room temperature magnetostriction of the composite material. A number of composite materials with chemical composition $(RE)_xT_{1-x}$, where RE represents one or a mixture of several rare earth metals, T represents Fe, Ni, Co or Mn or a mixture of two or more of these metals and x assuming a value $0<x\leq1$ represents atomic fraction, will have the mentioned properties. At evaluating different compositions of magnetostrictive composite rods 1 according to the invention the applicant has found that the following compositions A)–F) give good such properties in the composite rods:

A) $Tb_xD_{1-x}Fe_{2-w}$
wherein x and w represent atomic fractions within $0.2 \leq x \leq 1.0$ and $0 \leq w \leq 0.5$.

B) $Tb_xHo_{1-x}Fe_{2-w}$
wherein x and w represent atomic fractions within $0.2 \leq x \leq 1.0$ and $0 \leq w \leq 0.2$.

C) $Sm_xDy_{1-x}Fe_{2-w}$
wherein x and w represent atomic fractions within $0.8 \leq x \leq 1.0$ and $0 \leq w \leq 0.2$.

D) $Sm_xHo_{1-x}Fe_{2-w}$
wherein x and w represent atomic fractions within $0.6 \leq x \leq 1.0$ and $0 \leq w \leq 0.2$.

E) $Tb_xHo_yDy_zFe_{2-w}$
wherein x, y, z and w represent atomic fractions within $0.1 \leq x \leq 1.0$, $0 \leq y \leq 0.9$, $0 \leq z \leq 0.8$, and $0 \leq w \leq 0.2$ and $x+y+z=1$.

F) $Sm_xHo_yDy_zFe_{2-w}$
wherein x, y, z, and w represent atomic fractions within $0.6 \leq x \leq 1.0$, $0 \leq y \leq 0.4$, $0 \leq z \leq 0.4$, and $0 \leq w \leq 0.2$ and $x+y+z=1$.

Although some particularly favourable compositions of magnetostrictive composite materials are accounted for in the above it is understood that even other compositions with good properties are contained within the scope of the invention.

In the inventive magnetostrictive composite, the magnetostrictive material (i.e. powder) constitutes greater than 60% by volume of the composite. When a magnetostrictive material content of above 60% by volume is used, the magnetostrictive properties of the composite (such as magnetostrictive elongation, magnetostrictive coupling factors, and magnetic permeability) are improved in comparison to a composite with a lower amount of magnetostrictive material. Magnetostrictive properties are greatly improved if the amount of magnetostrictive material is increased. Therefore, a preferred embodiment of the composite employs magnetostrictive powder at a volume percentage in the range from about 70% to about 80%.

In a preferred method for manufacturing the composite, the magnetostrictive material is pressed with a binder prior to curing. The combination of magnetostrictive powder and binder is relatively dry and therefore it is necessary to press the mixture, before it is cured, in order to remove air inclusions and increase the density. The removal of air inclusions and increase in density results in a composite with improved mechanical properties in comparison to unpressed composites. If a low amount of magnetostrictive powder were employed, the mixture of powder and binder would behave more like a slurry and pressing would have no effect.

EXAMPLE 1

Terfenol-D ($Tb_{0.27-0.30}Dy_{0.73-0.70}Fe_{1.90-1.95}$) alloy powder was formed into a composite using a non-metallic insulating binder. The volume fraction of Terfenol-D was 80%. The Terfenol-D-particles were randomly oriented. Magnetostriction at 160 kA/m was approximately $0.5\times10^{-3}$ for a 16.3 MPa prestressed rod shaped sample of the composite. In this isotropic composite, the magnetostrictive powder was mixed with a epoxy resin and the mixture was uniaxially pressed with a pressure of 700 MPa and the pressed product was cured in an oven at 80° C. for 8 hours.

EXAMPLE 2

Terfenol-D ($Tb_{0.27-0.30}Dy_{0.73-0.70}Fe_{1.90-1.95}$) alloy powder was formed into a composite using a non-metallic insulating binder. The Terfenol-D particles were magnetically oriented. The volume fraction of Terfenol-D was 71%. Magnetostriction at 160 kA/m was approximately $0.8\times10^{-3}$ for a 16.3 MPa prestressed rod shaped sample of the composite. A magnetostriction of $1.53\times10^{-3}$ is predicted for full saturation. In this anisotropic composite, the magnetostrictive powder was mixed with a epoxy resin and the mixture was magnetically aligned in a magnetic field and then isostatically pressed under a pressure of 60 MPa. The pressed product was then cured in an oven at 80° C. for 8 hours.

Piezomagnetic properties of the Example 1 and Example 2 composites are shown in Table 1.

TABLE I

|  | H (kA/m) | $\mu_{rel}$ | d (nm/A) | $Y^H$ (GPa) | $k_{33}$ |
|---|---|---|---|---|---|
| Isotropic composite | 40 | 4.1 | 3.8 | 20.2 | 0.24 |
| (Example 1) | 80 | 2.8 | 3.7 | 19.7 | 0.28 |
|  | 120 | 2.2 | 3.1 | 19.2 | 0.26 |
| Anisotropic composite | 40 | 4.0 | 5.8 | 19.5 | 0.36 |
| (Example 2) | 80 | 2.9 | 5.9 | 17.0 | 0.40 |
|  | 120 | 2.2 | 4.8 | 17.0 | 0.38 |

Selected physical, electrical, and magnetic properties of the examples are shown in Table 2.

TABLE II

|  | $\delta \times 10^{-3}$ (kg/m³) | $\rho \times 10^8$ ($\Omega$m) | $T_c$ (°C.) | $M_s$ (T) | $\lambda \times 10^6$ at 120 kA/m |
| --- | --- | --- | --- | --- | --- |
| Isotropic composite (Example 1) | 7.5 | 30000 | 380 | 0.80 | 400 |
| Anisotropic composite (Example 2) | 6.8 | 60000 | 380 | 0.71 | 620 |

In order to improve the magnetostrictive composite material described by the invention, to increase the derivative $d\lambda/dH$, where $\lambda$ is magnetostriction and H is the magnetizing field, as well as magnetostriction at saturation one can, after pressing and after the binder has been cured, expose the magnetostrictive composite material to the following heat treatment:

- composite material is heated to a temperature above its Curie temperature, which means about 400° C.,
- thereafter, a magnetizing field of 40 kA/m amplitude is applied,
- finally the composite material is cooled down, with the magnetizing field still being applied, to a temperature below its Curie temperature.

The composite material can be further improved if it is exposed to external vibrations during pressing. This will increase the density and the permeability as well as facilitate the magnetic alignement of the magnetostrictive grains.

The above described method of manufacture of the magnetostrictive powder composite according to the invention often demands high pressing forces. In an alternative mode of execution according to the invention isostatic pressing is used, which usually means a lower pressing force than in the above described method.

In said alternative method, the magnetostrictive powder grains and the binder are pressed together isostatically, at which the composite material is directly pressed to an arbitrary final shape.

This isostatic pressing can be improved by magnetically aligning the magnetostrictive grains before the composite material has been pressed and before the binder has been cured. This is achieved by applying the magnetizing field along the working direction of the magnetostrictive powder composite.

Although the invention has been described with reference to its preferred embodiments, those of ordinary skill in the art may, upon reading this disclosure, appreciate changes and modifications which may be made and which do not depart from the scope and spirit of the invention as described above and claimed below.

We claim:

1. A composite of a magnetostrictive powder composition, comprising:

magnetostrictive powder grains of the formula:

$$(RE)_xT_{1-x}$$

wherein RE represents at least one rare earth metal,

T is selected from a group of metals consisting of iron, nickel, cobalt, and manganese, and x represents an atomic fraction having a value equal to 0 and less than or equal to 1; and a coating over the magnetostrictive grains insulating the grains from electrical contact with each other; and a binder;

wherein said magnetostrictive powder grains constitute a volume percentage of the composite from about a range of 70–80% volume of the composite.

2. The composite of claim 1, wherein the coating is of the same composition as the binder and is selected from the group of polymers consisting of resins and thermoplastic polymers.

3. The composite of claim 1, wherein the coating is a ceramic that encapsulates the magnetostrictive powder grains; and the binder is selected from the group consisting of resins or thermoplastic polymers.

4. The composite of claim 11, wherein the magnetostrictive powder grains are of the formula:

$$Tb_xDy_{1-x}Fe_{2-w}$$

wherein $0.2 \leq x \leq 1.0$, and $0 \leq w \leq 0.5$.

5. The composite of claim 1, wherein the magnetostrictive powder grains are of the formula:

$$Tb_xHo_{1-x}Fe_{2-w}$$

wherein $0.1 \leq x \leq 1.0$, and $0 \leq w \leq 0.2$.

6. The composite of claim 1, wherein the magnetostrictive powder grains are of the formula:

$$Sm_xDy_{1-x}Fe_{2-w}$$

wherein $0.8 \leq x \leq 1.0$, and $0 \leq w \leq 0.2$.

7. The composite of claim 1, wherein the magnetostrictive powder grains are of the formula:

$$Sm_xHo_{1-x}Fe_{2-w}$$

wherein $0.6 \leq x \leq 1.0$, and $0 \leq w \leq 0.2$.

8. The composite of claim 1, wherein the magnetostrictive powder grains are of the formula:

$$Tb_xHo_yDy_zFe_{2-w}$$

wherein $0.2 \leq x \leq 1.0$, $0 \leq y \leq 0.9$, $0 \leq z \leq 0.8$, and $0 \leq w \leq 0.2$, and $x+y+z=1.0$.

9. The composite of claim 1, wherein the magnetostrictive powder grains are of the formula:

$$Sm_xHo_yDy_zFe_{2-w}$$

wherein $0.6 \leq x \leq 1.0$, $0 \leq y \leq 0.4$, $0 \leq z \leq 2$, and $0 \leq w \leq 0.2$, and $x+y+z=1.0$.

10. The composite of claim 1, wherein the composite structure has opposite ends and the ends comprise high permeability powder grains so that the ends are electrical insulators even at high frequencies.

11. The composite of claim 1, wherein the composite structure has opposite ends and the ends comprise high resistivity powder grains so that the ends are electrical insulators even at high frequencies.

12. The composite of claim 1 further comprising mechanically reinforcing fibers.

13. The composite of claim 12, wherein said reinforcing fibers are selected from the group consisting of aluminum oxide, silicon carbide, aramide fiber, carbon, glass, and titanium fibers.

14. The composite of claim 1 further comprising permanent magnet powder grains in a sufficient concentration and at such locations in the composite structure that the composite has a homogeneous operating magnetization.

15. The composite of claim 14, wherein the permanent magnet powder is $Nd_2Fe_{14}B$.

16. The composite of claim 1 further comprising a coating on outer surfaces of the composite structure to provide lowered surface friction and increased chemical resistance.

17. The composite of claim 1 further comprising a coating on outer surfaces of the composite structure that contact other objects, said coating increasing the strength of the composite structure.

18. The composite of claim 1, wherein two or more metals are selected from the group of metals "T".

19. A method of forming a magnetostrictive composite material, the method comprising the steps of:

selecting magnetostrictive powder grains of the formula:

$(RE)_x T_{1-x}$ wherein RE represents at least one rare earth metal, T is selected from the group consisting of iron, nickel, cobalt, and manganese, and x represents an atomic fraction having a value equal to 0 and less than or equal to 1; and pressing the magnetostrictive powder grains with a binder to form a composite material wherein the magnetostrictive powder grains constitute from about a range of 70–80% by volume of the composite.

20. The method of claim 19 further comprising coating the formed composite structure with a coating that decreases surface friction and increases chemical resistance.

21. The method of claim 19 further comprising coating surfaces of the composite structure with a powder selected from the group consisting of aluminum oxide and silicon carbide.

22. The method of claim 19 further comprising the step of pressing the magnetostrictive powder with a binder under sufficient applied pressure to at least partially reduce air inclusion before the forming step.

23. The method of claim 22, wherein the pressing of the grains and binder is under isostatic conditions.

24. The method of claim 22, further comprising the step of applying a magnetic field along an axis to achieve magnetic alignment of the magnetostrictive powder grains before pressing the powder grains with the binder.

25. The method of claim 22, wherein the binder is a resin; and further comprising the step of curing the resin.

26. The method of claim 22 further comprising curing the pressed binder and magnetostrictive powder to form a cured product; and heat treating the cured product to increase the derivative $d\lambda/dH$, where $\lambda$ is the magnetostriction, and H is the magnetizing field and its saturation magnetostriction.

27. The method of claim 26, wherein the heat treating is carried out by heating to a temperature above a Curie temperature of the cured product.

28. The method of claim 27 further comprising applying a magnetizing field with an amplitude of 40 kA/M to the cured product, after the heating treating.

29. The method of claim 28 further comprising cooling the cured product to below its Curie temperature, while applying the magnetizing field.

30. The method of claim 22, further comprising vibrating the resin and magnetostrictive powder grains during pressing to improve the density, permeability, and magnetic alignment of the magnetostrictive grains.

* * * * *